United States Patent
Ross

[19]

[11] Patent Number: 5,933,842
[45] Date of Patent: Aug. 3, 1999

[54] METHOD AND SYSTEM FOR COMPRESSING PUBLICATION DOCUMENTS IN A COMPUTER SYSTEM BY SELECTIVELY ELIMINATING REDUNDANCY FROM A HIERARCHY OF CONSTITUENT DATA STRUCTURES

[75] Inventor: Benjamen Eric Ross, Seattle, Wash.

[73] Assignee: Microsoft Corporation, Redmond, Wash.

[21] Appl. No.: 08/660,149

[22] Filed: May 23, 1996

[51] Int. Cl.⁶ .................................................. G06F 17/30
[52] U.S. Cl. ........................ 707/514; 707/101; 707/104
[58] Field of Search .................... 395/612, 774, 395/776, 613; 707/500, 501, 513, 514, 515, 101, 102, 104, 202

[56] References Cited

U.S. PATENT DOCUMENTS

| | | | |
|---|---|---|---|
| 4,468,732 | 8/1984 | Raver | 395/613 |
| 5,481,701 | 1/1996 | Chambers, IV | 395/612 |
| 5,490,242 | 2/1996 | Tamura | 395/774 |
| 5,548,751 | 8/1996 | Ryu et al. | 395/613 |
| 5,557,772 | 9/1996 | DeRose et al. | 395/774 |
| 5,592,667 | 1/1997 | Bugajski | 395/613 |
| 5,596,746 | 1/1997 | Shen et al. | 395/612 |
| 5,659,767 | 8/1997 | Nguyen et al. | 95/777 |

*Primary Examiner*—Joseph H. Feild
*Attorney, Agent, or Firm*—Jones & Askew, LLP

[57] ABSTRACT

A method and system for compressing publication documents in a computer system is provided. In a preferred embodiment, one or more computer documents are initially represented in a data structure. The data structure is made up of a number of constituent data structures connected by links. In order to compress the data structure, two or more constituent data structures that match are identified. All but one of the identified constituent data structures are then deleted. Finally, links to the deleted constituent data structures are replaced with links to the selected constituent data structure.

20 Claims, 11 Drawing Sheets

METHOD AND SYSTEM FOR COMPRESSING PUBLICATION DOCUMENTS IN A COMPUTER SYSTEM BY SELECTIVELY ELIMINATING REDUNDANCY FROM A HIERARCHY OF CONSTITUENT DATA STRUCTURES

TECHNICAL FIELD

The invention relates generally to the field of computer document management, and, more specifically, to the field of computer document compression.

BACKGROUND OF THE INVENTION

Users of computer systems utilize different kinds of application programs ("applications") to perform various kinds of tasks. One such kind of application is a publication application, which may be utilized by users to produce professional-quality printed publications. The users of a typical application can produce publications containing rich text, graphics, extensive formatting, and footnotes.

Publication applications typically store the information relating to a publication in a file or file system object called a publication document. Because of the extensive content that publications may contain described above, publication documents often grow quite large, consuming significant quantities of storage resources and requiring a substantial amount of time and/or significant bandwidth to copy or transmit. This effect is compounded when several publication documents are stored together, e.g., when shipping sample publication documents to the user of a publication application. An effective way to reduce the size of publication documents without significantly reducing the extensiveness of that content would therefore be desirable.

SUMMARY OF THE INVENTION

The present invention provides a method and system for compressing computer documents. In accordance with the invention, a software facility ("the facility") preferably stores a number of computer documents, preferably publication documents, in a compressed format called a "compressed document set." Publication documents are comprised of a multi-level data structure organized as a tree of constituent data structures. For each page in a document, a constituent data structure in the publication document data structure corresponding to the page references a list of constituent data structures each corresponding to one visual element on the page. The visual element data structures each further reference separate constituent data items that contain name, formatting, or content data for the visual element.

A compressed document set, once constructed, is a tree whose general arrangement is similar to the tree data structures that represent the publication documents that it represents, but contains less data: instead of copying constituent data structures from the documents into the compressed document set that would be redundant in the compressed document set, the invention merely inserts in the compressed document set a reference to the copy of the constituent data structure that is already contained in the compressed document set. To construct a compressed document set from documents, therefore, the invention traverses the data structures for these publication documents in depth-first order. For each constituent data structure visited in the traversal of the document, the invention determines whether the compressed document set already contains the constituent data structure. If the compressed document set does not already contain the constituent data structure, the invention adds the constituent data structure to the compressed document set and inserts a reference in the compressed document set that refers to the newly added constituent data structure. If, on the other hand, the compressed document set does already contain the constituent data structure, the invention does not add the constituent data structure to the compressed document set, but merely inserts a reference in the compressed document set that refers to the matching constituent data structure already contained in the compressed document set. The result is a compressed document set that contains no duplicate constituent data structures. After compression, any document, and even any page of any document, may be individually extracted from the compressed document set into the normal publication document format.

DETAILED DESCRIPTION OF THE INVENTION

A method and system for compressing publication documents is provided. In a preferred embodiment, a software facility ("the facility") stores a number of computer documents, preferably publication documents, in a compressed format called a "compressed document set." Publication documents are comprised of a multi-level data structure organized as a tree of constituent data structures. For each page in a document, a constituent data structure in the publication document data structure corresponding to the page references a list of constituent data structures each corresponding to one visual element on the page. The visual element data structures each further reference separate constituent data items that contain name, formatting, or content data for the visual element.

A compressed document set, once constructed, is a tree whose general arrangement is similar to the tree data structures that represent the publication documents that it represents but contains less data: instead of copying constituent data structures from the documents into the compressed document set that would be redundant in the compressed document set, the facility inserts in the compressed document set a reference to the copy of the constituent data structure that is already contained in the compressed document set. To construct a compressed document set from publication documents, therefore, the facility traverses the data structures for these publication documents in depth-first order. For each constituent data structure visited in the traversal of the tree data structure, the facility determines whether the compressed document set already contains the constituent data structure. If the compressed document set does not already contain the constituent data structure, the facility adds the constituent data structure to the compressed document set and inserts a reference in the compressed document set that refers to the newly added constituent data structure. If, on the other hand, the compressed document set does already contain the constituent data structure, the facility does not add the constituent data structure to the compressed document set, but merely inserts a reference in the compressed document set that refers to the matching constituent data structure already contained in the compressed document set. The result is a compressed document set that contains no duplicate constituent data structures. After compression, any document, and even any page of any document, may be individually extracted from the compressed document set into the normal publication document format.

Figure 1:
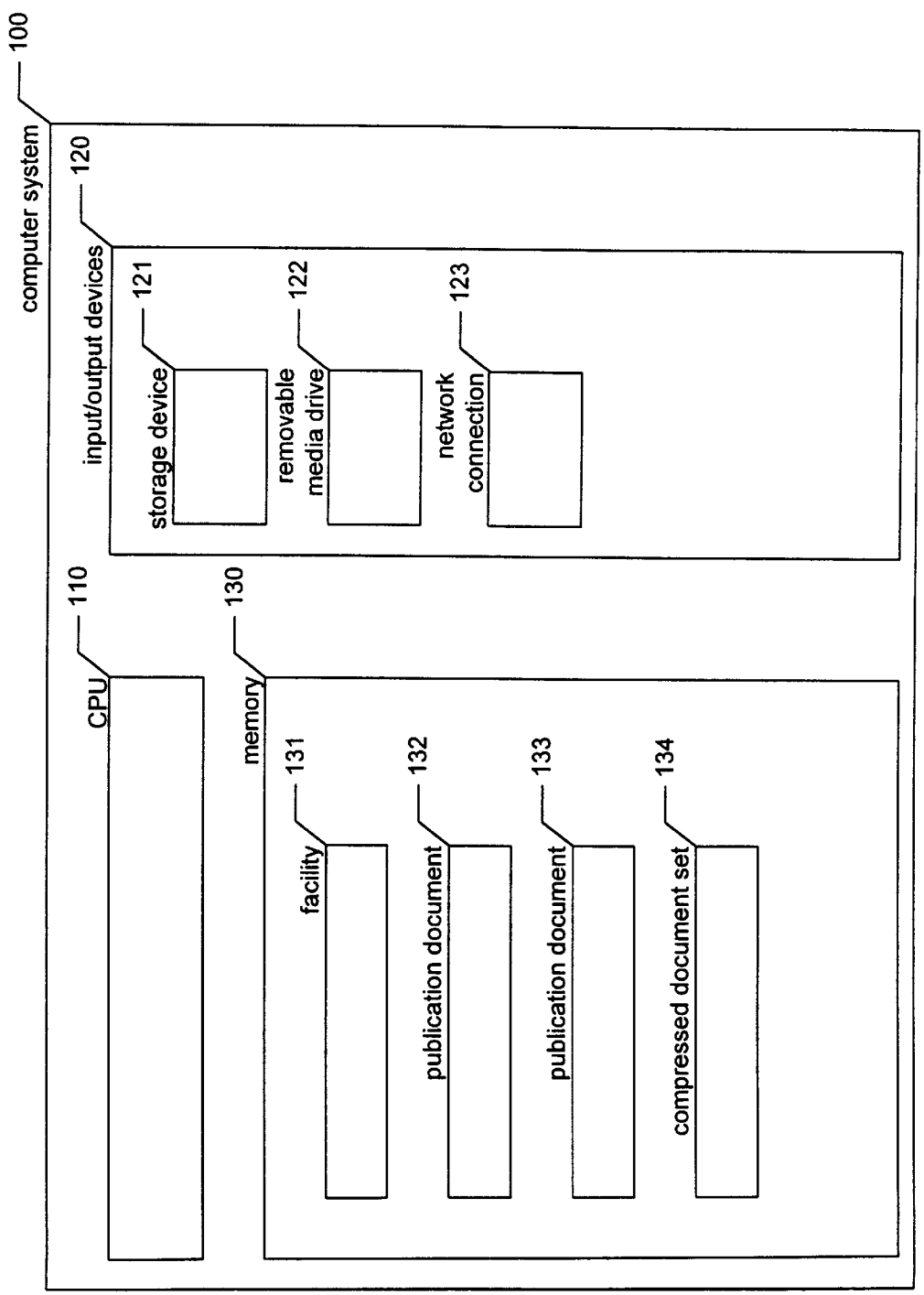
FIG. 1 is a high-level block diagram of the general-purpose computer system upon which the facility preferably operates.

FIG. 1 is a high-level block diagram of the general-purpose computer system upon which the facility preferably operates. The computer system 100 contains a central processing unit (CPU) 110, input/output devices 120, and a computer memory (memory) 130. Among the input/output devices is a storage device 121, such as a hard disk drive. The input/output devices also include a removable media drive 122, which can be used to install software products, including the facility, which are provided on a computer-readable medium, such as a CD-ROM. The input/output devices further include a network connection 123 that enables the computer system to exchange data with other computer systems via a network (not shown). The computer programs that preferably comprise the facility 131 reside in the memory and execute on the CPU. The memory preferably also contains one or more publication documents 132–133. After the operation of the facility, the memory preferably also contains a compressed document set 134 representing the publication documents. This compressed document set may also be stored on the storage device, or on a removable medium using the removable media drive. The compressed document set may also be transmitted to other computer systems using the network connection. While the facility is preferably implemented on a computer system configured as described above, those skilled in the art will recognize that it may also be implemented on computer systems having different configurations.

To illustrate the operation of the facility, its operation is discussed herein in conjunction with a simplified example shown in FIGS. 2A–5. The operation of the facility is then described more formally in conjunction with flow diagrams shown in FIGS. 6A–8.

Figure 2A:
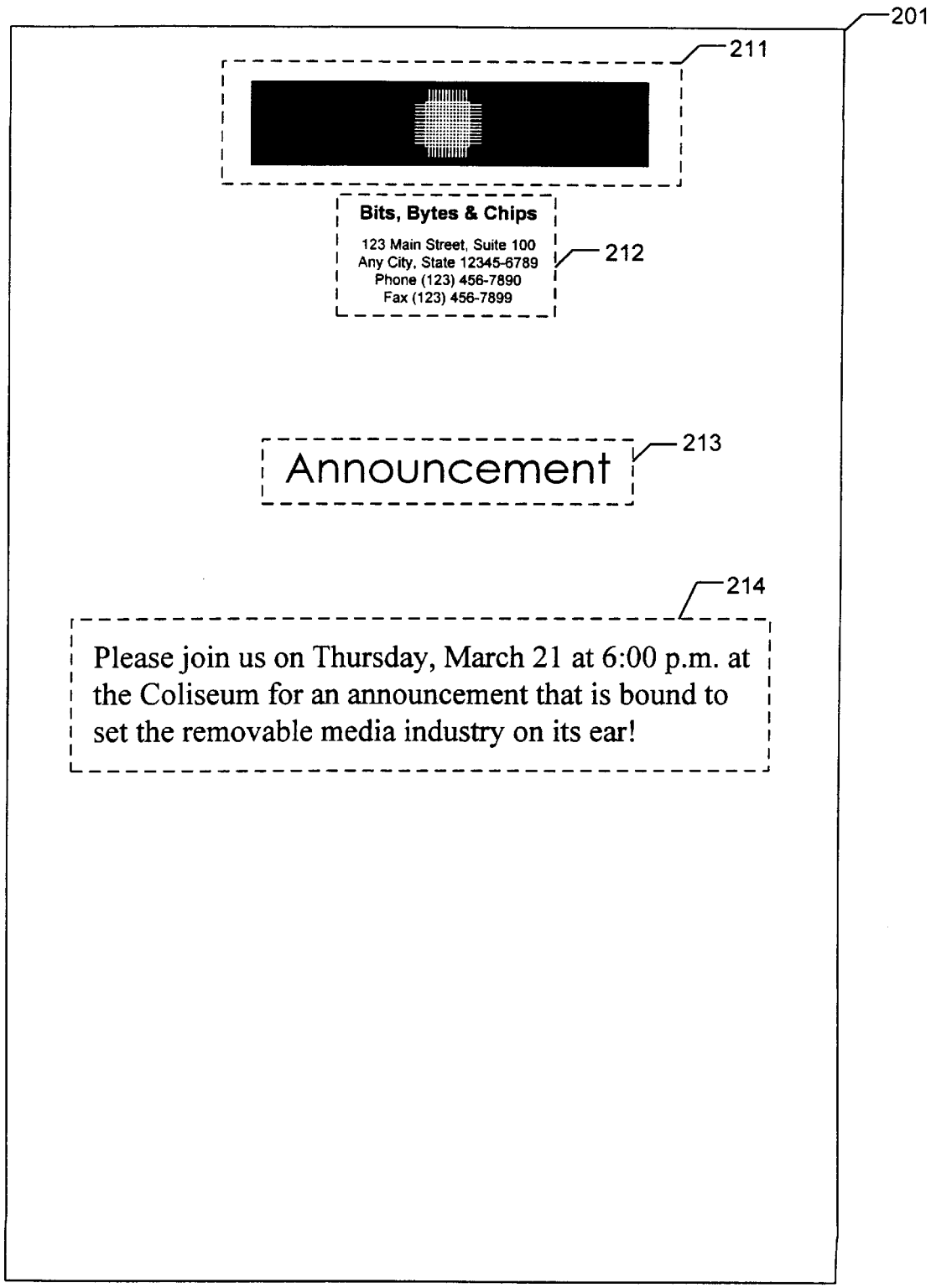
FIGS. 2A–2C are publication diagrams showing sample documents whose data structures may be compressed using the facility.
Figure 2B:
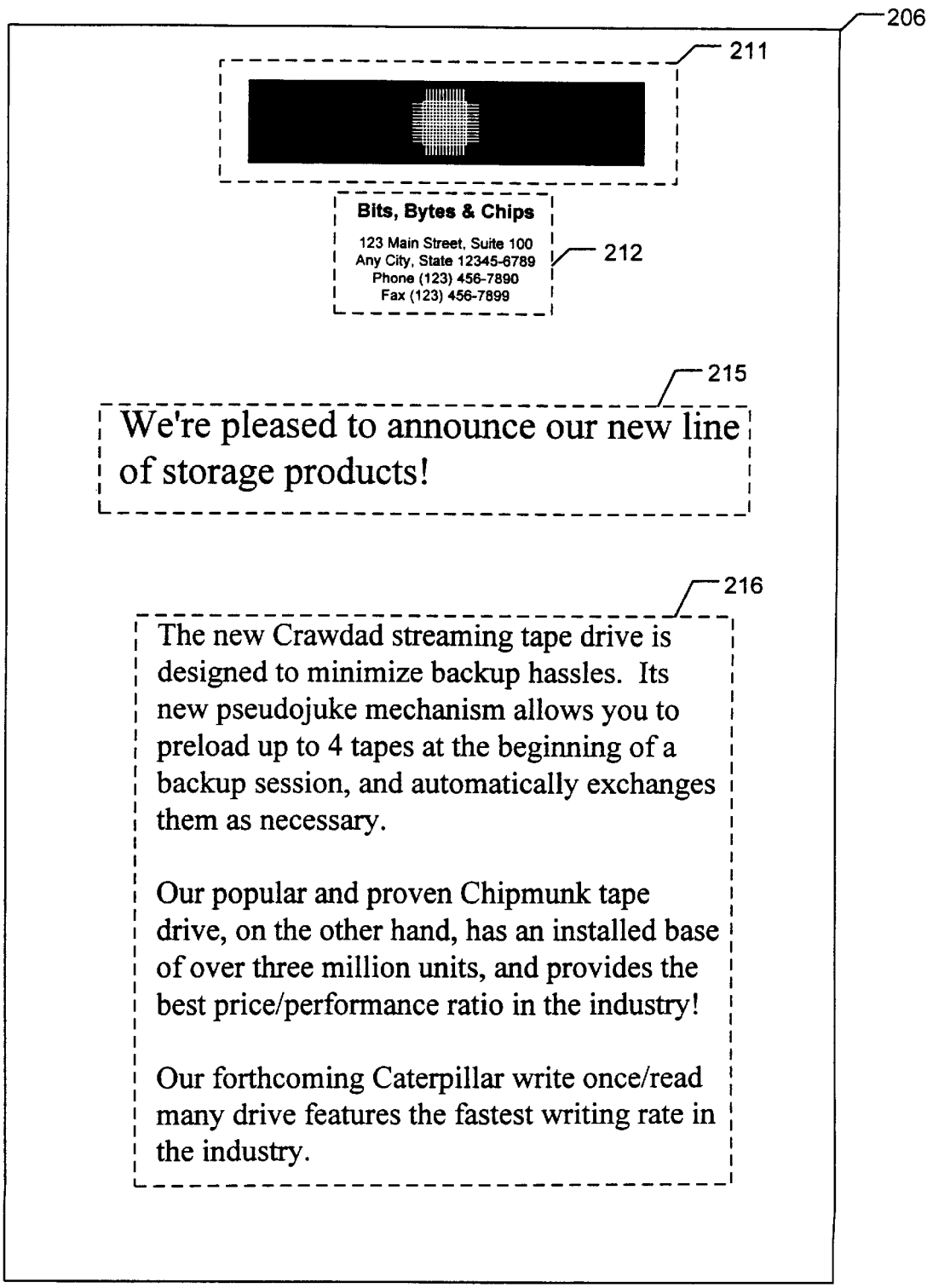
Figure 2C:
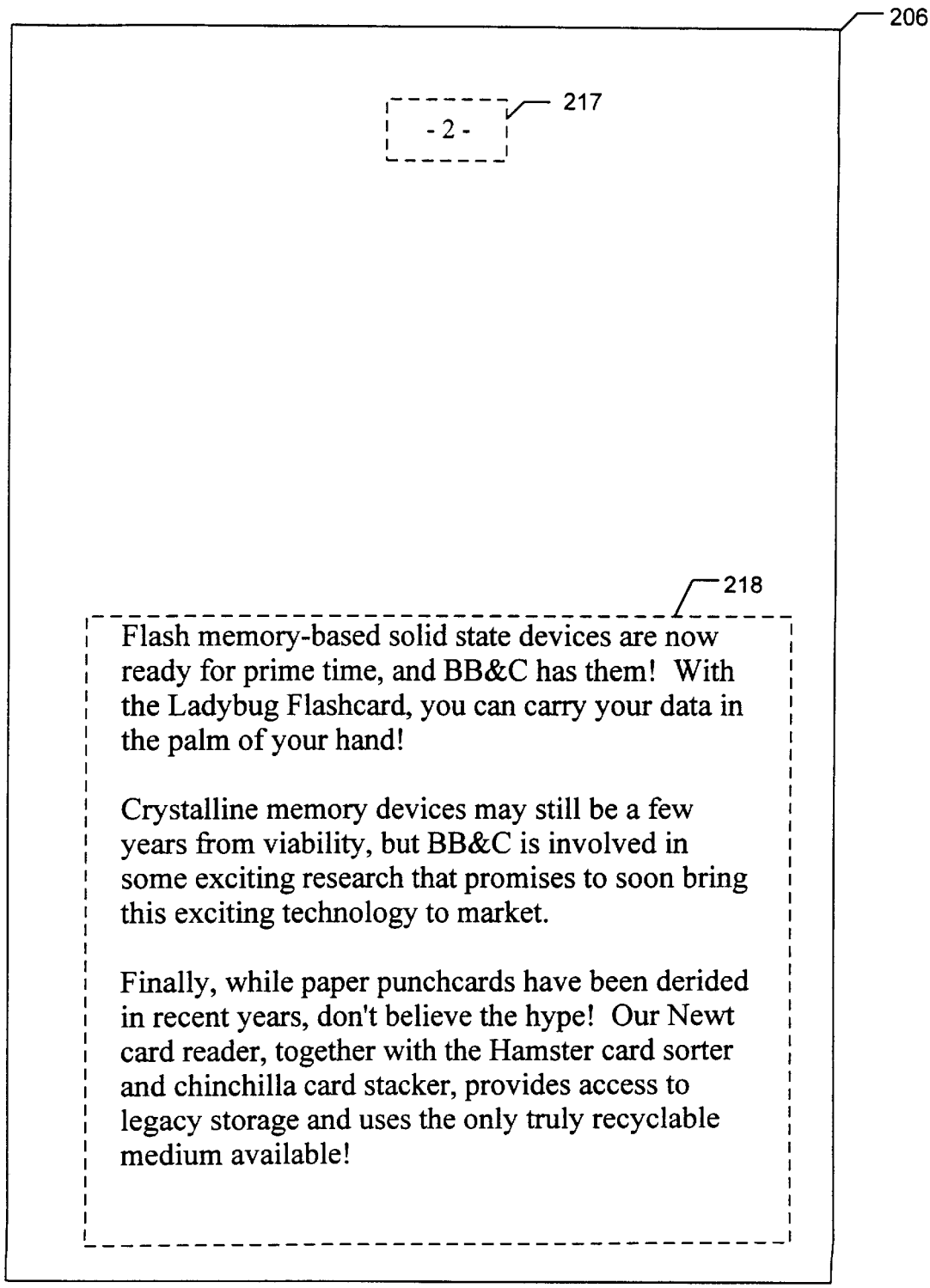

FIGS. 2A–2C are publication diagrams showing sample publication documents whose data structures may be compressed using the facility. A first, announcement document has just one page 201, which is shown in FIG. 2A. A second, product list document has two pages 206 and 207, which are shown in FIGS. 2B–2C. The announcement document shown in FIG. 2A contains four visual elements, each conveying meaning to a reader of the document: a logo graphic visual element 211 and three text block visual elements 212, 213, and 214. The product list document shown in FIGS. 2B–2C has four visual elements on page 206 (a logo graphic 211, three text blocks 212, 215, and 216), and two visual elements on page 207 (text blocks 217 and 218). It can be seen that logo graphic 211 and text box 212 are identical and present on both pages 201 and 206. Further, the formatting of text boxes 216 and 218 are the same as the formatting of text box 214, in that the text in these text blocks is rendered in the same font, at the same size, and with the same values for further formatting properties.

Figure 3A:
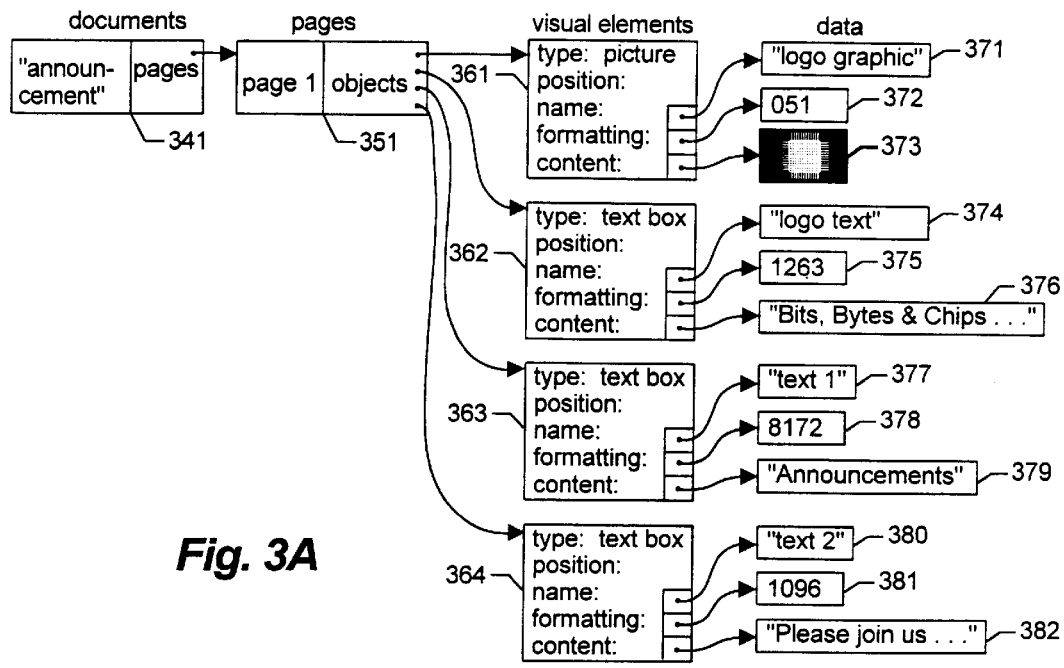
FIGS. 3A and 3B are data structure diagrams showing sample document data structures used by a publication application to represent the sample announcement and product list publication documents, respectively.
Figure 3B:
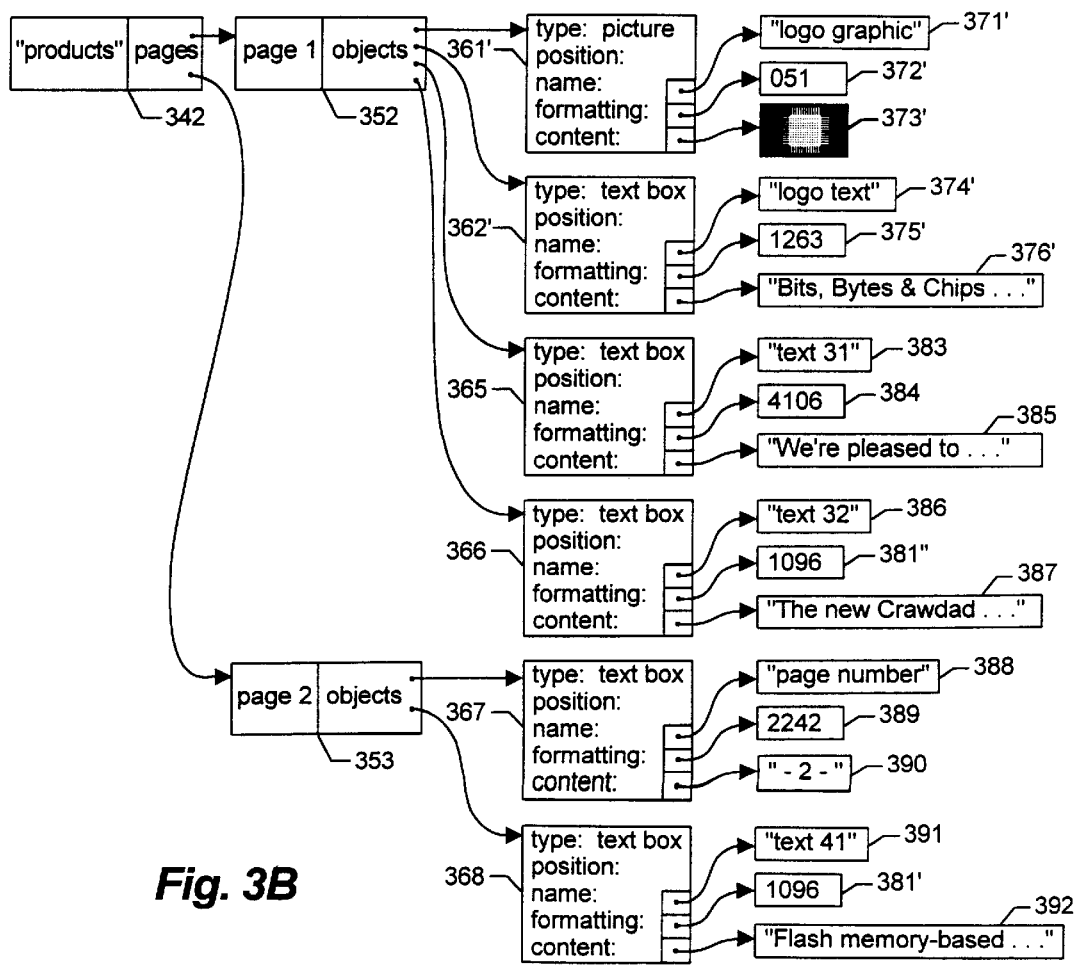

FIGS. 3A and 3B are data structure diagrams showing same document data structures used by a publication application to represent the sample announcement and product list publication documents, respectively. The organization of these sample document data structures is illustrative only; those skilled in the art will recognize that the facility may be straightforwardly adapted to compress document data structures having other organizations. The announcement document data structure shown in FIG. 3A is made up of a number of linked constituent data structures 341, 351, 361–364, and 371–382. The announcement document data structure contains one document descriptor constituent data structure 341. The document descriptor preferably contains information specific to the document it represents, such as the name of the document, the identity of its author, and the date of its last revision. The document descriptor further contains a reference, or "link," to one page descriptor constituent data structure for each page of the document. Since the announcement document has a single page, the data structure contains one page descriptor 351, which is referenced by the document descriptor. The page descriptor preferably includes information specific to the page it represents, such as its size. The page descriptor further includes references to one visual element descriptor constituent data structure for each visual element of the page. Visual element descriptors 361–364 represent the visual elements 211–214 shown in FIG. 2A. For example, visual element descriptor 361 represents logo graphic 211, while visual element descriptor 364 represents text box 214. Each visual element descriptor preferably contains information specific to the visual element, such as the type and position of the visual element. Visual element descriptors each further contain references to data item constituent data structures used to render the visual elements represented by the visual element descriptors. Visual element descriptors preferably each contain a reference to a name data item specifying a name for the visual element, a formatting data item specifying formatting for visual elements, and a content data item specifying the content of the visual element. For example, visual element descriptor 361 contains references to a name data item 371 containing the name of the logo graphic visual element, a formatting data item 372 containing formatting information for the logo graphic, and a content data item 373 containing the graphic content of the visual element. It can be seen that the other visual element descriptors also contain references to similar data items.

FIG. 3B shows the document data structure for the product list publication document. The publication document data structure contains two page descriptors 356 and 357, one for each page of the product list document. As with the announcement document data structure, each page descriptor contains references to visual element descriptors representing the visual elements contained in each of the pages of the product list document. Visual element descriptors each further contain references to data item constituent data structures used to render the visual elements represented by the visual element descriptors.

In order to store the announcement document, a publication application would typically store the entire contents of the announcement document data structure shown in FIG. 3A. Similarly, in order to store the entire product list document data structure, a publication application would typically store the document data structure shown in FIG. 3B in its entirety.

In order to reduce the amount of storage space consumed by storing publication documents and the amount of network bandwidth consumed by transmitting publication documents to other computer systems, the facility compresses them together into a compressed document set. In the case of the example announcement and product list documents, the facility compresses the document data structures shown in FIGS. 3A and 3B into a compressed document set data structure shown in FIG. 4. Those skilled in the art will recognize that the facility can similarly be used to compress a larger number of documents, each larger and more complex than those shown in the example.

Figure 4:
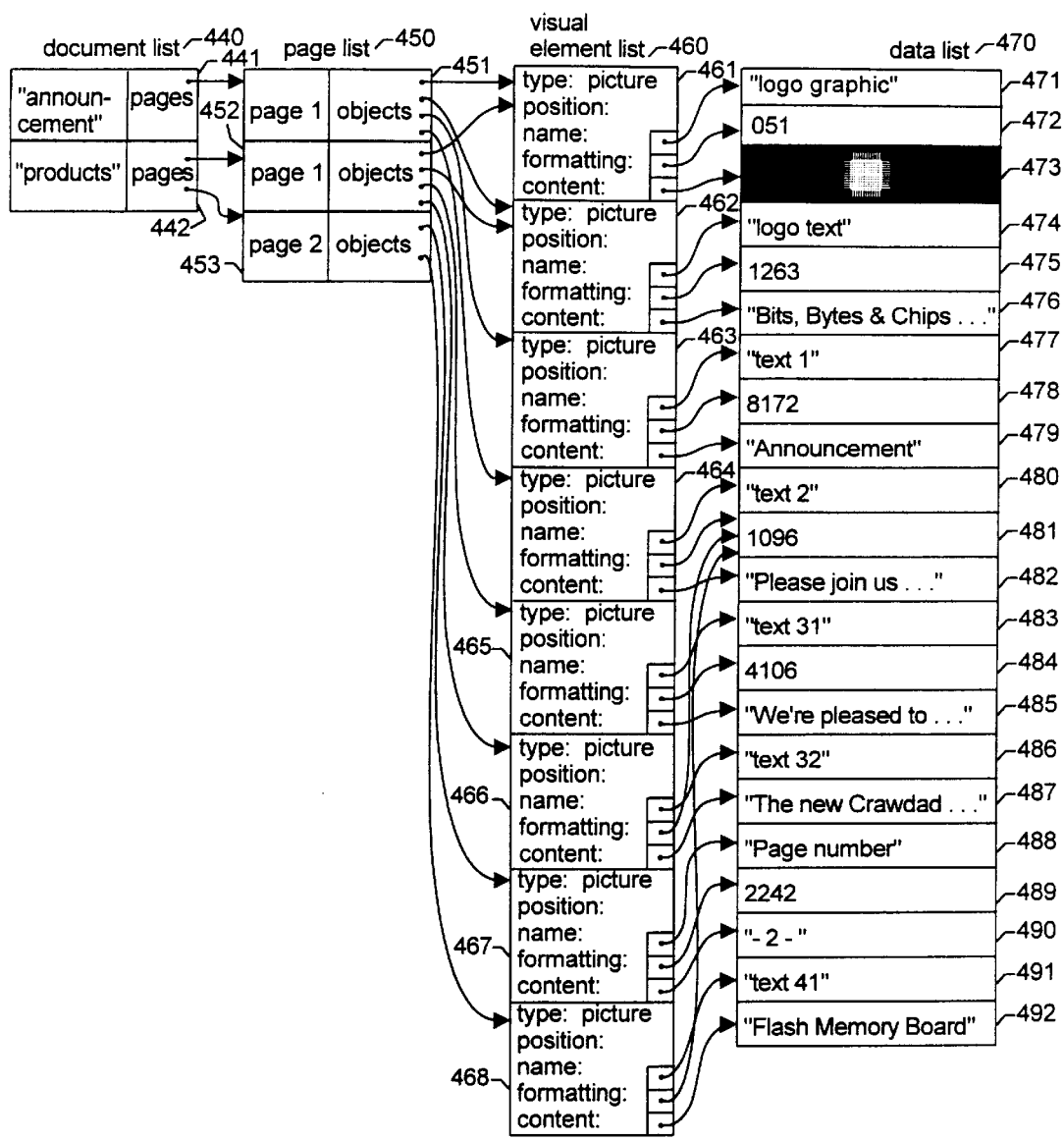
FIG. 4 is a data structure diagram showing a compressed document set data structure produced by the facility from the announcement and product list document data structures to represent the sample announcement and product list documents.

FIG. 4 is a data structure diagram showing a compressed document set data structure produced by the facility from the announcement and product list document data structures to represent the sample announcement and product list documents. The facility constructs the compressed document set data structure by building four lists: a document list 440 containing document descriptors, a page list 450 containing page descriptors, a visual element list 460 containing visual element descriptors, and a data list 470 containing data items. The four lists of the compressed document set data structure generally contain the constituent data structures from each of the document data structures, except that duplicate visual element descriptors and data items from the document data structures appear only once in the visual element list and data list, respectively, of the compressed document set data structure. Document list 440 therefore contains one document descriptor for each document descriptor shown in FIGS. 3A–3B. The use of a document list containing document descriptors enables particular documents to be distinguished within the compressed document set produced by the facility. In cases in which it is unimportant to know which document a particular page represented in the compressed document set belongs to, the document list may be omitted from the compressed document set data structure in order to reduce its size. If the document list is omitted, however, a page cannot be retrieved from the compressed document set based on the document it belongs to. Similarly, the page list 450 contains one page descriptor for each page descriptor shown in FIGS. 3A–3B.

Visual element list 460, however, contains only the unique visual element descriptors shown in FIGS. 3A–3B: duplicate visual element descriptors 361' and 362' shown in FIG. 3B do not occur in visual element list 460. Rather, page descriptor 452 contains references to visual element descriptors 461 and 462, which match visual element descriptors 361' and 362' and do occur in the visual element list. Similarly, the data list 470 contains the data items shown in FIGS. 3A–3B, except for duplicate data items 371', 372', 373', 374', 375', 376', 381', and 381". Visual element descriptors that in the document data structure refer to duplicate data items refer in the compressed document set data structure to the single matching data item in the data list. For example, visual element descriptor 466, instead of referring to data item 481' which is not in data list 470, refers to matching data item 481 which is in the data list. The compressed document set data structure produced by the facility therefore contains a complete representation of all the compressed documents, but excludes redundant copies of visual element descriptors and data items that occur more than once in the compressed documents.

The elimination of duplicate visual element descriptors and data items is based on an observation that duplicate visual element descriptors and data items occur more frequently in a representative sample of documents than duplicate document and page descriptors. With respect to publication documents having the structure described, therefore, a threshold is established between the page list and the visual element list such that the facility eliminates duplicate entries in the visual element and data lists, but not in the document and page lists. Those skilled in the art will recognize that this threshold could beneficially be repositioned for different document structures or document samples.

Entries in the lists of the compressed document set data structure are connected by references, also called links. These references are generally represented in the compressed document set data structure as either the number of the entry in the list for lists having uniform-sized entries (e.g., the fifth visual element descriptor in the visual element list), or as byte offsets from the beginning of the list for lists having variable-sized entries (e.g., the data item beginning at the two hundredth byte of the data list). For references of the latter type, the length of the data item is preferably stored as well as the byte offset, either as part of the reference, or as the first data occurring in the item referred to by the reference.

List entries that may contain a variable number of references to constituent data structures in the next level are usually variable-sized. As such, references to list entries that may contain a variable number of references must generally be of the less efficient byte offset type. For instance, because the number of visual elements on a page may vary, page descriptors must be able to contain a variable number of references to visual element descriptors. This variability in the number of references to visual element descriptors that a page descriptor must be able to contain requires that page descriptors, i.e., entries in the page list, be of variable size. These variable-sized entries can be converted to uniform-sized entries, however, by interposing a special "run" list between such a list and the lower-level list to which it refers, allowing the converted entries to be referred to by the more efficient entry number type references. This run list is a list containing all of the references from the higher-level list. Instead of containing these references, the higher-level list merely contains the numbers of the first and last reference in the run list pertaining to the higher level entry. For example, if a run list was interposed between the page list 450 and the visual element list 460 (FIG. 4), the first four items in the run list would be references to the first four visual elements in the visual element list: 461, 462, 463, and 464. Page descriptor 451, instead of containing these references, would merely contain a first reference number of one and a last reference number of four referring to the first four entries in the run list. Likewise, the next four items in the run list would be copied from page descriptor 452, and would be replaced in page descriptor 452 with a first reference number of five and a last reference number of eight. (While these examples show the use of mutually exclusive ranges in the run list, the ranges for different page descriptions may preferably overlap to conserve space in the run list for objects that are on both of two adjacent pages.) Because replacing a variable number of references in page descriptors with a first and last reference number indexing into the run list makes page descriptors uniform-sized, the more efficient entry number type references may be used in the document list to refer to page descriptors instead of the less efficient byte offset type references.

Figure 5:
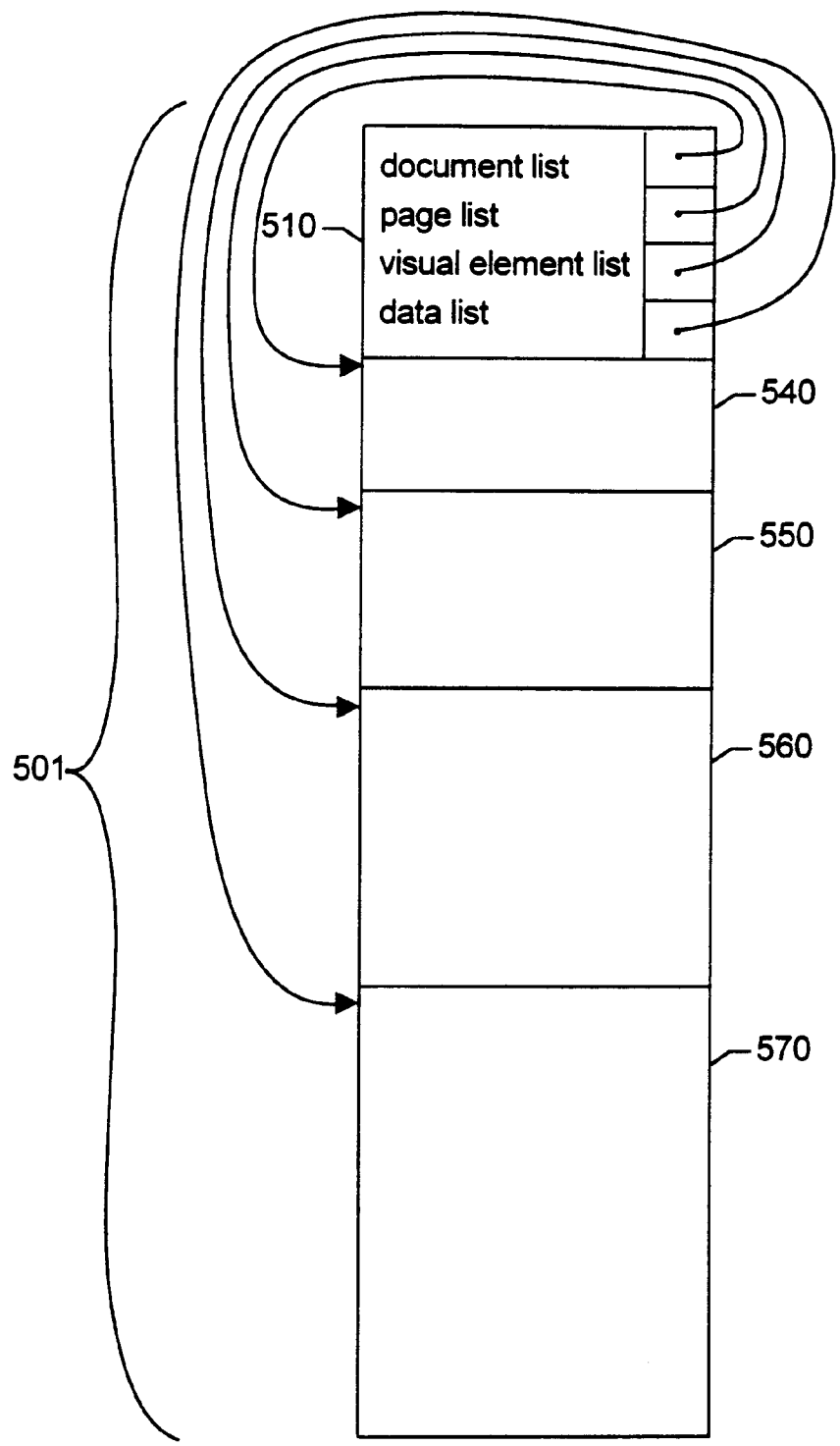
FIG. 5 is a data structure diagram showing a concatenated compressed document set data structure.

After the facility finishes constructing the four lists that make up the compressed document set data structure, the facility preferably concatenates all the lists together and generates a header containing references to each of the lists. FIG. 5 is a data structure diagram showing a concatenated compressed document set data structure. The concatenated compressed document set data structure 501 contains document list 540, page list 550, visual element list 560, and data list 570. The concatenated compressed document set data structure further contains a header 510 containing references to each of the lists within the concatenated compressed document data set. These references preferably constitute byte offsets from the beginning of the concatenated compressed document set data structure to the beginning of each list.

Figure 6A:
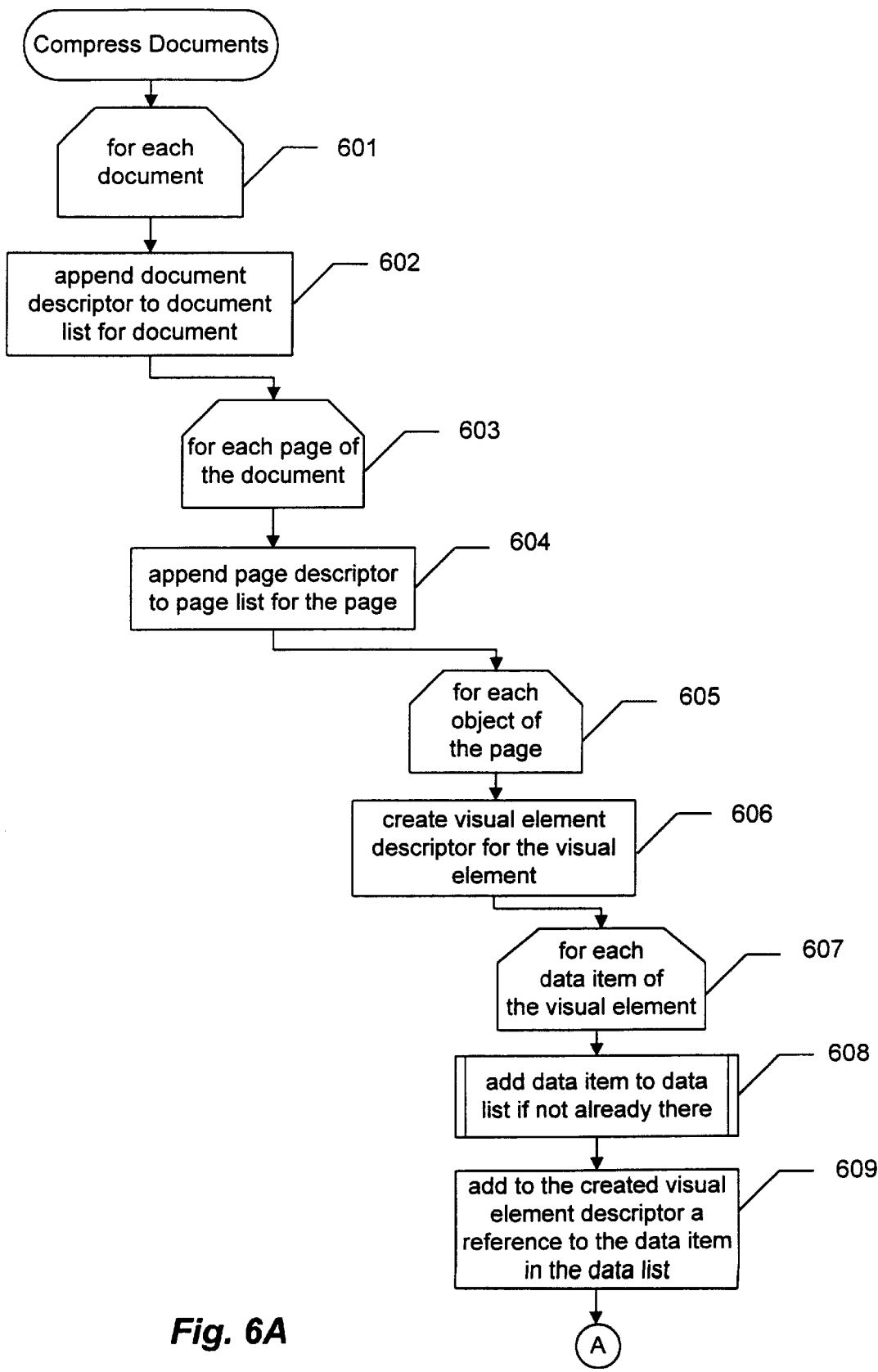
FIGS. 6A–6B together contain a flow diagram of a Compress Documents routine preferably called by the facility in order to compress a set of documents.
Figure 6B:
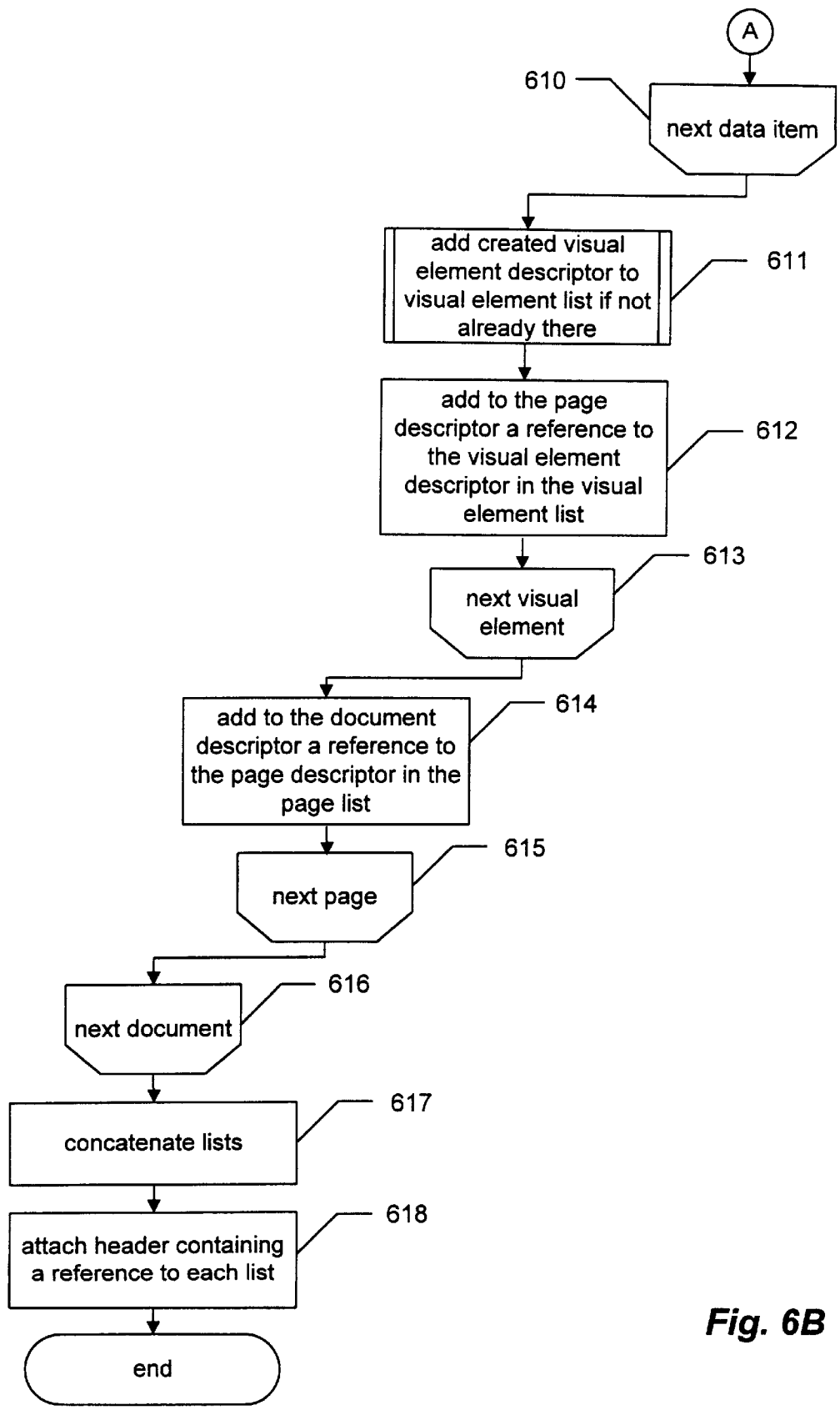

The detailed operation of the facility is discussed below in conjunction with FIGS. 6–8. FIGS. 6A–6B together contain a flow diagram of a Compress Documents routine preferably called by the facility in order to compress a set of documents. The Compress Documents routine contains four embedded loops, each delineated by "loop limit" symbols discussed on page 6 of ANS/ISO 5807-1985, a standard for, among other things, symbols and conventions for program flow charts promulgated by the International Standards Organization and adopted by the American National Standards Institute. In the Compress Documents routine, the facility loops through the documents to be compressed in steps 601–616; the pages of each documents in steps 603–615; the visual elements on each page in steps 605–613; and the data items of each object in steps 607–610. In steps 601–616, the facility loops through the documents to be compressed. In step 601, the facility begins the document loop. In step 602, the facility appends a document descriptor to the document list for the document. The document descriptor appended in step 602 preferably contains information specific to the document, such as the name of the document, the identity of its author, and the date of its last revision. The appended document descriptor will eventually also contain references to page descriptors in the page list representing the pages of the document.

In steps 603–616, the facility loops through the pages of the document. In step 603, the document loop begins. In step 604, the facility appends a page descriptor to the page list to represent the page. The appended page descriptor preferably includes information specific to the page, such as its size. The appended page descriptor will eventually also contain references to visual element descriptors in the visual element list representing the visual elements on the page.

In steps 605–615, the facility loops through the visual elements on the page. In step 605, the visual element loop begins. In step 606, the facility creates an visual element descriptor for the visual element. The created visual element descriptor preferably contains information specific to the visual element, such as the type and position of the visual element. The created visual element descriptor will eventually also contain references to data items in the data list representing data items of the visual element. The created visual element descriptor is not immediately appended to the visual element list.

Steps 607–610, the facility loops through the data items of the visual element. As discussed above, the data items of a visual element preferably include a name, formatting, and content. In step 607, the data item loop begins. In step 608, the facility appends the data item to the data list if the data item is not already present in the data list. Step 608 is discussed in greater detail in conjunction with FIG. 7, which contains a more detailed flow diagram of the performance of step 608. In step 609, the facility adds to the visual element descriptor created in step 606 a reference to the data item in the data list. As will be discussed in more detail below, if the data item was appended to the data list in step 608, then the reference added to the visual element descriptor is to the appended data item; otherwise, the reference added to the visual element descriptor in step 609 is to a matching data item that was already in the data list. In step 610, the data item loop ends. If more data items remain for the visual element, then a facility continues at step 607, else the facility continues at step 611.

In step 611, the facility appends the created visual element descriptor to the visual element list if the created visual element descriptor is not already in the visual element list. Step 611 is discussed in greater detail in conjunction with FIG. 8, which is a more detailed flow diagram during the performance of step 611. In step 612, the facility adds to a page descriptor appended to the page list in step 604, a reference to the visual element descriptor in the visual element list. As is discussed in greater detail below, if the created visual element descriptor is appended to the visual element list in step 611, then the reference added to the visual element descriptor is to the appended created visual element descriptor; otherwise, the reference added to the visual element descriptor in step 612 is to a matching visual element descriptor already in the visual element list. In step 613, the visual element loop ends. If more visual elements remain for the page, the facility continues at step 605, else the facility continues at step 614.

In step 614, the facility adds to the document descriptor appended to the document list in step 602 a reference to the page descriptor appended to the page list in step 604. In step 615, the page loop ends. If more pages remain for the document, then the facility continues at step 603, else the facility continues at step 616. In step 616, the document loop ends. If more documents to be compressed remain, then the facility continues at step 601, else the facility continues at step 617.

In step 617, the facility preferably concatenates the document, page, object, and data lists in a single contiguous block. In step 618, the facility attaches to the concatenated lists a header containing a reference to each list in the concatenated block. These steps then conclude.

Figure 7:
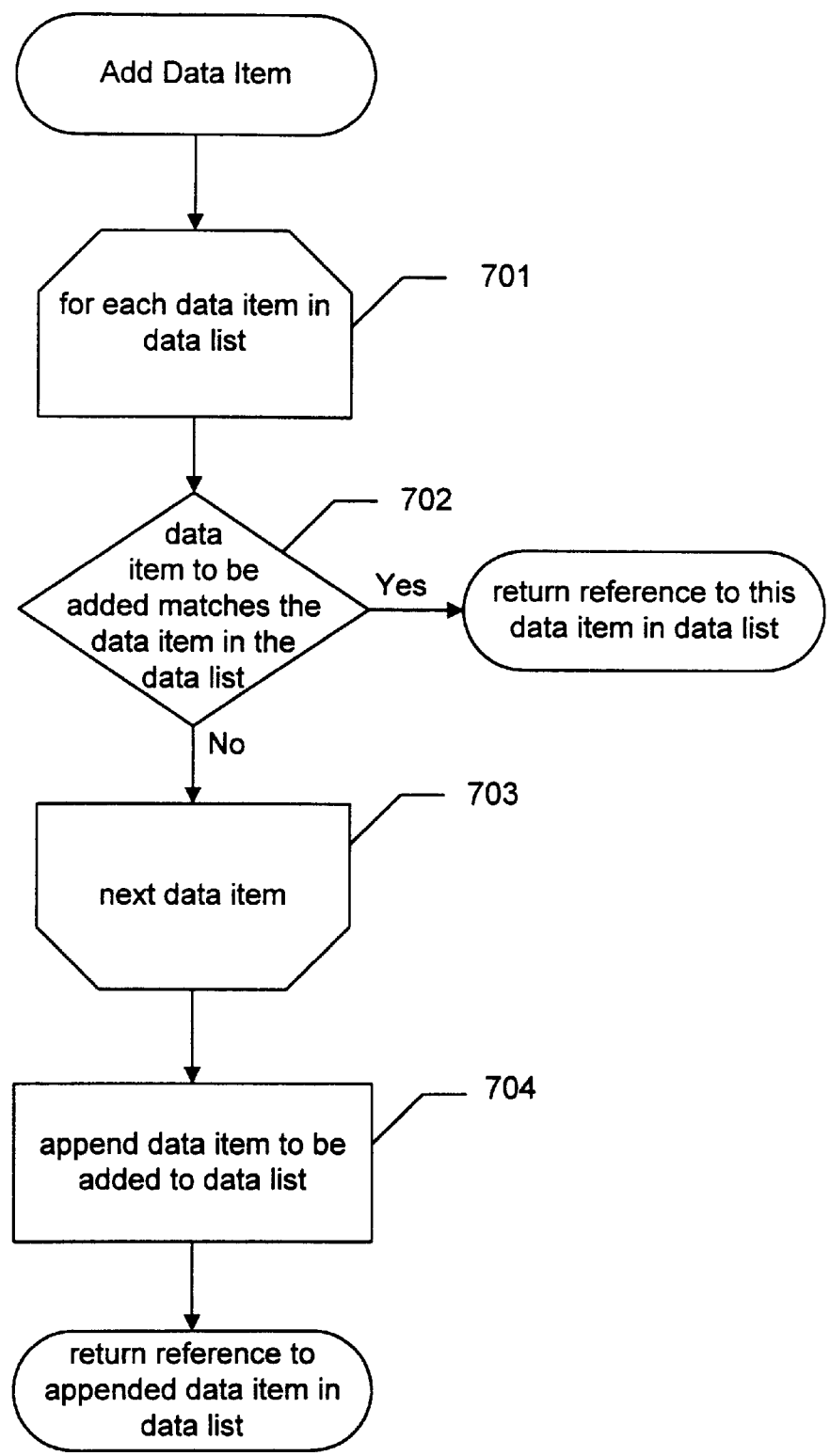
FIG. 7 is a flow diagram showing the Add Data Item routine, which is preferably called by the facility in step 608 (FIG. 6) to add a data item to the data list if necessary.

FIG. 7 is a flow diagram showing the Add Data Item routine, which is preferably called by the facility in step 608 (FIG. 6) to add a data item to the data list if necessary. In steps 701–703, the facility loops through the data items in the data list. In step 702, the facility determines whether the data item to be added to the data list matches the data item in the data list. This determination preferably involves determining whether these two data items contain the same data. In step 702, if the data item to be added to the data list matches the data item in the data list, then the facility returns a reference to this data item in the data list, which is added to the object descriptor in step 609 (FIG. 6), else the facility continues at step 703. In step 703, the data item loop ends. If more data items remain, then the facility continues at step 701, else the facility continues at step 704. In step 704, because the data item to be added does not match any data item in the data list, the facility appends the data item to be added to the data list. The facility then returns a reference to the appended data item in the data list, which the facility adds to the object descriptor in step 609 (FIG. 6). These steps then conclude.

Figure 8:
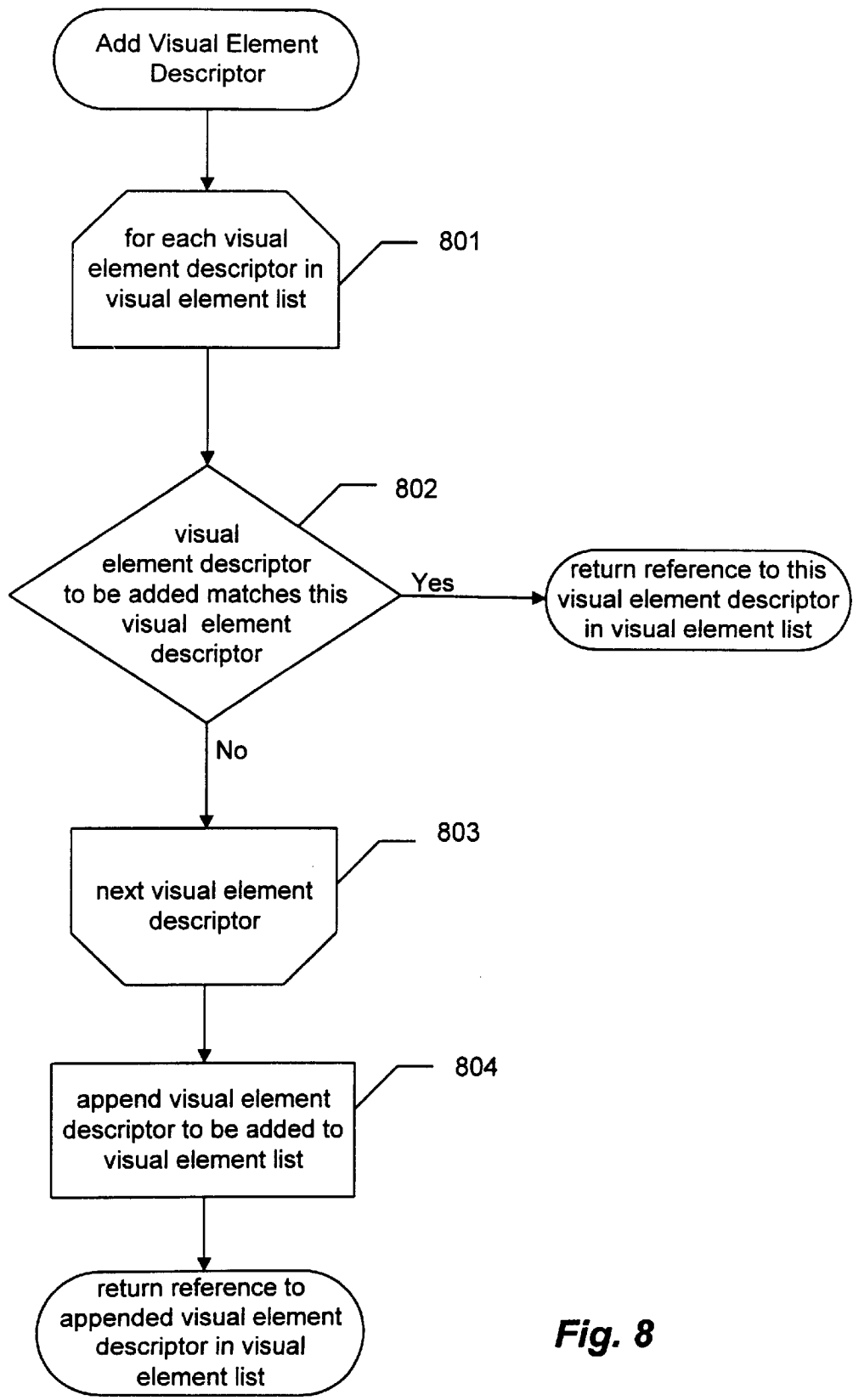
FIG. 8 is a flow diagram showing the Add Visual Element Descriptor routine, which is preferably called by the facility in step 611 (FIG. 6) to add a visual element descriptor to the object list, if necessary.

FIG. 8 is a flow diagram showing the Add Visual Element Descriptor routine, which is preferably called by the facility in step 611 (FIG. 6) to add a visual element descriptor to the object list, if necessary. In steps 801–803, the facility loops through the visual element descriptors in the visual element list. In step 802, the facility determines whether the visual element descriptor to be added to the visual element list matches the visual element descriptor in the visual element list. This determination preferably involves determining whether these two items contain the same visual element-specific information (e.g., the visual element type in position) and references to all of the same data items in the data list. In step 802, if the visual element descriptor to be added to the visual element list matches the visual element descriptor in the visual element list, then the facility returns a reference to this visual element descriptor in the visual element list, which is added to the page descriptor in step 612 (FIG. 6), else the facility continues at step 803. In step 803, the visual element descriptor loop ends. If more visual element descriptors remain, then the facility continues at step 801, else the facility continues at step 804. In step 804, because the visual element descriptor to be added does not match any visual element descriptor in the visual element list, the facility appends the visual element descriptor to be added to the visual element list. The facility then returns a reference to the appended visual element descriptor in the visual element list, which the facility adds to the page descriptor in step 612 (FIG. 6). These steps then conclude. Those skilled in the art will recognize the general correspondence between the steps shown in FIG. 8 and those shown in FIG. 7.

A document stored by the facility in a compressed document set may preferably be decompressed by locating the document descriptor for the document in the document list and following the references in the document descriptor to the pages of the document, the references to the visual element descriptors and the pages descriptors and the references in the visual element descriptors to the data items, copying each of these list entries into the decompressed document and establishing links between them.

A single page of a document stored by the facility in a compressed document set may similarly be decompressed by finding the document in the document list, finding the page descriptor for the appropriate page among the page descriptors referred to by the document descriptor, and following the references in the page descriptor to the visual element descriptors and from the visual element descriptors to the data items, copying each visual element descriptor or data item referred to by a traversed reference into the compressed document and establishing links between them.

While this invention has been shown and described with reference to preferred embodiments, it will be understood by those skilled in the art that various changes or modifications in form and detail may be made without departing from the scope of the invention. For example, computer documents of all types comprised of constituent data structures make it be compressed using the facility. Such documents need not be arranged in pages or have any of the other exemplary features discussed above in conjunction with the sample document data structures.

I claim:

1. A method in a computer system for compressing a level of a multiple-level source data structure representing one or more documents while generating a destination data structure from the source data structure, the source data structure made up of constituent data structures each at one of the levels of the source data structure, the method comprising the steps of:

selecting a level of the source data structure at which the source data structure is to be compressed, two or more of the constituent data structures at the selected level of the source data structure containing the same data, each constituent data structure at the selected level of the source data structure being referred to by a reference in a constituent data structure at the next higher level of the source data structure;

identifying all unique constituent data structures at the selected level of the source data structure that do not contain the same data;

storing the identified unique constituent data structures in the destination data structure; and for each constituent data structure at the next higher level of the source data structure:

replacing a reference in the constituent data structure at the next higher level that refers to a constituent data structure at the selected level of the source data structure with a reference that refers to a constituent data structure of the selected level stored in the destination data structure that contains the same data as the constituent data structure at the selected level of the source data structure, and storing the constituent data structure of the next higher level in the destination data structure.

2. A method in a computer system for compressing a data structure representing one or more computer documents, the data structure comprised of a multiplicity of constituent data structures connected by links, the method comprising the steps of:

identifying a plurality of matching constituent data structures;

deleting all but a selected one of the identified constituent data structures; and replacing links to the deleted constituent data structures with links to the selected constituent data structure.

3. The method of claim 2 wherein each constituent data structure has contents, and wherein the identifying step determines that all of the constituent data structures identified as matching have the same contents.

4. The method of claim 3 wherein the contents of the identified constituent data structures include indications of links to one or more other constituent data structures, and wherein the determining step further determines that the indications of links in the identified constituent data structures indicate that the identified constituent data structures are each linked to the same other constituent data structures.

5. The method of claim 3 wherein the data structure comprises an acyclic directed graph of constituent data structures.

6. A method in a computer system for decompressing data representing a portion of a document, comprising the steps of:

retrieving a compressed data structure representing one or more documents, the compressed data structure comprising a plurality of constituent data structures connected by references, the constituent data structures including at least two constituent data structures that each reference a multiply-referenced constituent data structure;

receiving an indication of a portion of a document represented by the compressed data structure to decompress;

identifying a constituent data structure in the compressed data structure corresponding to the document portion indicated by the received indication;

copying the identified constituent data structure from the compressed data structure to a decompressed data structure; and for each reference in any path originating at the identified constituent data structure:

copying the constituent data structure to which the reference refers to a decompressed data structure, and establishing a reference in the decompressed data structure to the copied constituent data structure from the copy in the decompressed data structure of the constituent data structure in the compressed data structure containing the reference.

7. The method of claim 6, wherein at least two of the constituent data structures that reference the multiply-referenced constituent data structure are referenced in paths originating at the identified constituent data structure, and wherein the copying step is performed separately for each such constituent data structure such that the decompressed data structure contains multiple copies of the multiply-referenced constituent data structure, each of which is referenced by only one constituent data structure in the decompressed data structure.

8. A computer-readable medium whose contents cause a computer system to compress data representing one or more documents, the data structure comprised of a multiplicity of constituent data structures connected by links, by performing the steps of:

identifying a plurality of matching constituent data structures;

deleting all but a selected one of the identified constituent data structures; and replacing links to the deleted constituent data structures with links to the selected constituent data structure.

9. The computer-readable medium of claim 8 wherein each constituent data structure has contents, and wherein the identifying step determines that all of the constituent data structures identified as matching have the same contents.

10. The computer-readable medium of claim 9 wherein the contents of the identified constituent data structures include indications of links to other constituent data structures, and wherein the determining step further determines that the indications of links in the identified constituent data structures indicate that the identified constituent data structures are each linked to the same other constituent data structures.

11. A computer-readable medium whose contents cause a computer system to decompress data representing a document by performing the steps of:

retrieving a compressed data structure representing one or more documents, the compressed data structure comprising a plurality of constituent data structures connected by references, the constituent data structures including at least two constituent data structures that each reference a multiply-referenced constituent data structure;

receiving an indication of a portion of a document represented by the compressed data structure to decompress;

identifying a constituent data structure in the compressed data structure corresponding to the document portion indicated by the received indication;

copying the identified constituent data structure from the compressed data structure to a decompressed data structure; and for each reference in any path originating at the identified constituent data structure:

copying the constituent data structure to which the reference refers to a decompressed data structure, and establishing a reference in the decompressed data structure to the copied constituent data structure from the copy in the decompressed data structure of the constituent data structure in the compressed data structure containing the reference.

12. The computer-readable medium of claim 11 wherein at least two of the constituent data structures that reference the multiply-referenced constituent data structure are referenced in paths originating at the identified constituent data structure, and wherein the contents of the computer-readable medium cause the copying step to be performed separately for each such constituent data structure such that the decompressed data structure contains multiple copies of the multiply-referenced constituent data structure, each of which is referenced by only one constituent data structure in the decompressed data structure.

13. A memory containing a compressed publication constituent data structure for representing at least a portion of at least one publication, comprising lower-level constituent data structures linked to higher-level constituent data structures by references from higher-level constituent data structures to lower-level constituent data structures, the lower-level constituent data structures each containing content or formatting for the represented publications, at least one of the lower-level constituent data structures being linked to two or more higher-level constituent data structures by the inclusion of two or more references from different higher-level constituent data structures to the same lower-level constituent data structure.

14. The memory of claim 13 wherein the higher-level constituent data structures each represent one page of a represented publication, and wherein the lower-level constituent data structures linked to a higher-level constituent data structure contains content or formatting for the page that the higher-level constituent data structure represents.

15. A computer system for compressing data representing one or more documents, the data structure comprised of a multiplicity of constituent data structures connected by links, comprising:

a match identification sub-system for identifying a plurality of matching constituent data structures;

a link replacement sub-system for replacing links to all but a selected one of the identified constituent data structures with a link to the selected identified constituent data structure; and a constituent data structure deletion sub-system for deleting all of the identified constituent data structures except the selected identified constituent data structure.

16. A computer system for decompressing data representing a portion of a document, comprising:

a retrieval subsystem for retrieving a compressed data structure representing one or more documents, the compressed data structure comprising a plurality of constituent data structures connected by references, the constituent data structures including at least two constituent data structures that each reference a multiply-referenced constituent data structure;

a receiver for receiving an indication of a portion of a document represented by the compressed data structure to decompress;

a constituent data structure identification subsystem for identifying a constituent data structure in the compressed data structure corresponding to the document portion indicated by the received indication; and a decompression subsystem for:
  copying the identified constituent data structure from the compressed data structure to a decompressed data structure, and
  for each reference in any path originating at the identified constituent data structure:
    copying the constituent data structure to which the reference refers to a decompressed data structure; and
    establishing a reference in the decompressed data structure to the copied constituent data structure from the copy in the decompressed data structure of the constituent data structure in the compressed data structure containing the reference.

17. The apparatus of claim 16 wherein at least two of the constituent data structures that reference the multiply-referenced constituent data structure are referenced in paths originating at the identified constituent data structure, and wherein the decompression subsystem copies each such constituent data structure separately such that the decompressed data structure contains multiple copies of the multiply-referenced constituent data structure, each of which is referenced by only one constituent data structure in the decompressed data structure.

18. A method in a computer system for producing a compressed data structure representing a plurality of document pages, each page containing visual elements each having a set of features concerning its rendering on the page, the method comprising the steps of:

A) initializing a page list for containing page descriptors, a visual element list for containing visual element descriptors referred to by page descriptors, and a data list for containing data items referred to by visual element descriptors; and B) for each of the plurality of pages:
    (I) adding a page descriptor to the page list representing the page, for each visual element contained by the page,
    (II) creating a visual element descriptor representing the visual element,
    (III) for each feature in the set of features of the visual element:
      (a) creating a data item representing the feature,
      (b) comparing the created data item to the data items present in the data list,
      (c) if a data item present in the data list matches the created data item, establishing a link from the created visual element descriptor to the matching data item in the data list, and
      (d) if no data item present in the data list matches the created data item:
        (i) adding the created data item to the data list, and
        (ii) establishing a link from the created visual element descriptor to the matching data item in the data list,
    (III) comparing the created visual element descriptor, including the links established from the created visual element descriptor, to the visual element descriptors present in the visual element list,
    (IV) if a visual element descriptor present in the visual element list matches the created visual element descriptor, establishing a link from the created page descriptor to the matching visual element descriptor in the visual element list, and
    (V) if no visual element descriptor present in the visual element list matches the created visual element descriptor:
      (a) adding the created visual element descriptor to the visual element list, and
      (b) establishing a link from the created page descriptor to the matching visual element descriptor in the visual element list,
  such that the visual element list is comprised of unique visual element descriptors and the data list is comprised of unique data items.

19. The method of claim 18, further including the steps of:
  receiving a plurality of documents each comprising one or more pages; and
  concatenating the pages of the received documents together to obtain the plurality of document pages.

20. A method in a computer system for compressing a source data structure representing one or more computer documents into a destination data structure representing the computer documents, the source data structure comprised of a plurality of consistent data structures arranged as a tree and connected by references, the arrangement of the data structure defining a depth for each constituent data structure, the method comprising the steps of:

(A) providing a threshold identifying the depths at which only a portion of the constituent data structures are to be guaranteed unique;
  (B) traversing the data structure in depth-first order and, for each constituent data structure visited in the traversal:
    (I) if the depth of the visited constituent data structure is not at least as large as the threshold:
      (a) adding to the destination data structure a constituent data structure corresponding to the visited constituent data structure of the source data, and
      (b) establishing a reference in the destination data structure, the reference from a constituent data structure of the destination data structure corresponding to the constituent data structure of the source data structure that refers to the visited constituent data structure, the reference to the added constituent data structure, and
    (II) if the depth of the visited constituent data structure is at least as large as the threshold:
      (a) comparing the visited constituent data structures to the constituent data structures already in the destination data structures,
      (b) if the visited constituent data structure matches a constituent data structure already in the destination data structure, establishing a reference in the destination data structure, the reference from a constituent data structure of the destination data structure corresponding to the constituent data structure of the source data structure that refers to the visited constituent data structure, the reference to the added constituent data structure, without adding to the destination data structure a constituent data structure corresponding to the visited constituent data structure of the source data to the destination data structure, and (c) if the visited constituent data structure does not match any of the constituent data structure already in the destination data structure:
  (i) adding to the destination data structure a constituent data structure corresponding to the visited constituent data structure of the source data, and
  (ii) establishing a reference in the destination data structure, the reference from a constituent data structure of the destination data structure corresponding to the constituent data structure of the source data structure that refers to the visited constituent data structure, the reference to be added constituent data structure, such that every constituent data structure in the destination data structure whose depth is at least as large as the threshold is unique.

* * * * *